United States Patent
Partlo et al.

(10) Patent No.: US 6,359,922 B1
(45) Date of Patent: Mar. 19, 2002

(54) SINGLE CHAMBER GAS DISCHARGE LASER WITH LINE NARROWED SEED BEAM

(75) Inventors: William N. Partlo, Poway; Xiaojiang Pan; Eckehard D. Onkels, both of San Diego, all of CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/421,701

(22) Filed: Oct. 20, 1999

(51) Int. Cl.[7] .............................. H01S 3/22; H01S 3/223
(52) U.S. Cl. ............................................ 372/58; 372/57
(58) Field of Search ................................ 372/61, 57, 58

(56) References Cited

U.S. PATENT DOCUMENTS

| | | | |
|---|---|---|---|
| 4,534,035 A | 8/1985 | Long | |
| 5,070,513 A | 12/1991 | Letardi | |
| 5,848,089 A | * 12/1998 | Sarkar et al. | 372/58 |
| 5,970,082 A | * 10/1999 | Ershov | 372/102 |
| 6,026,103 A | * 2/2000 | Oliver et al. | 372/37 |
| 6,034,978 A | * 3/2000 | Ujazdowski et al. | 372/34 |
| 6,128,323 A | * 10/2000 | Myers et al. | 372/38 |

OTHER PUBLICATIONS

Balla and Hart, "Spectral brightness and other improvements to the tunable ArF excimer laser," *Rev. Sci. Instrum.*, vol. 59, No. 7, pp. 2591–2594(Jul. 1998).
Bollanti et al., "Compact three electrodes excimer laser IANUS for a POPA optical system," In: High–power gas and solid state lasers; Proceedings of the Meeting, Vienna, Austria, Apr. 5–8, 1994 (A95–2267605–36), Bellingham, WA, Society of Photo–Optical Instrumentation Engineers (SPIE Proceedings, vol. 2206, 1994, pp. 144–153.

* cited by examiner

*Primary Examiner*—Teresa M. Arroyo
*Assistant Examiner*—Davienne Monbleau
(74) *Attorney, Agent, or Firm*—John R. Ross, Esq.

(57) ABSTRACT

A single chamber gas discharge laser system having a pulse power source for producing electrical discharges at the rate of at least 1000 pulses per second. The discharge along with laser optics create two short lived gain media, one for producing a seed beam and the other for amplifying the seed beam. Laser gas circulation around a chamber circulation path is provided and the electrodes and discharges are arranged so that debris from one of the gain media is not circulated to the other gain media during discharges until the debris has made a loop around at least 90% of the chamber circulation path.

9 Claims, 10 Drawing Sheets

SINGLE CHAMBER GAS DISCHARGE LASER WITH LINE NARROWED SEED BEAM

This invention relates to gas discharge laser systems and in particular to such systems having a seed beam for wavelength selection.

BACKGROUND OF THE INVENTION

The natural bandwidth of many gas discharge lasers is relatively broad and many applications of such lasers require very narrow bandwidths. For example, state of the art integrated circuit lithography systems utilize KrF excimer lasers for which the bandwidth has been reduced from its natural width of about 300 pm to less than 1.0 pm.

Figure 1:
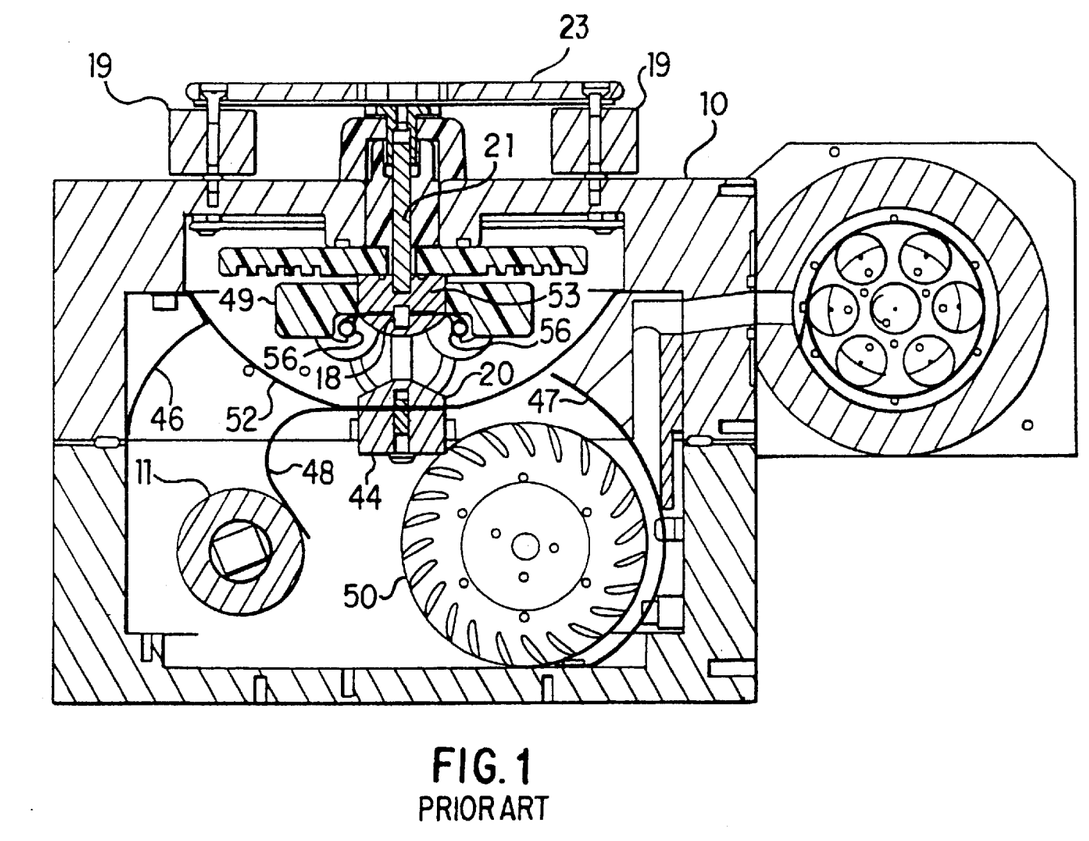
FIG. 1 shows a cross section view of a prior art laser chamber.
Figure 2A:
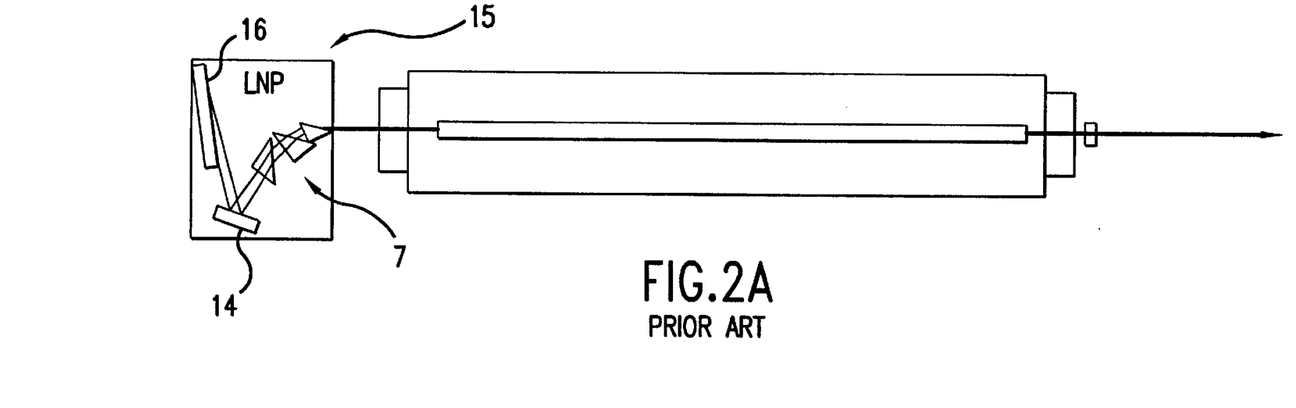
FIGS. 2A and 2B depict a prior art line narrowed laser system.
Figure 2B:
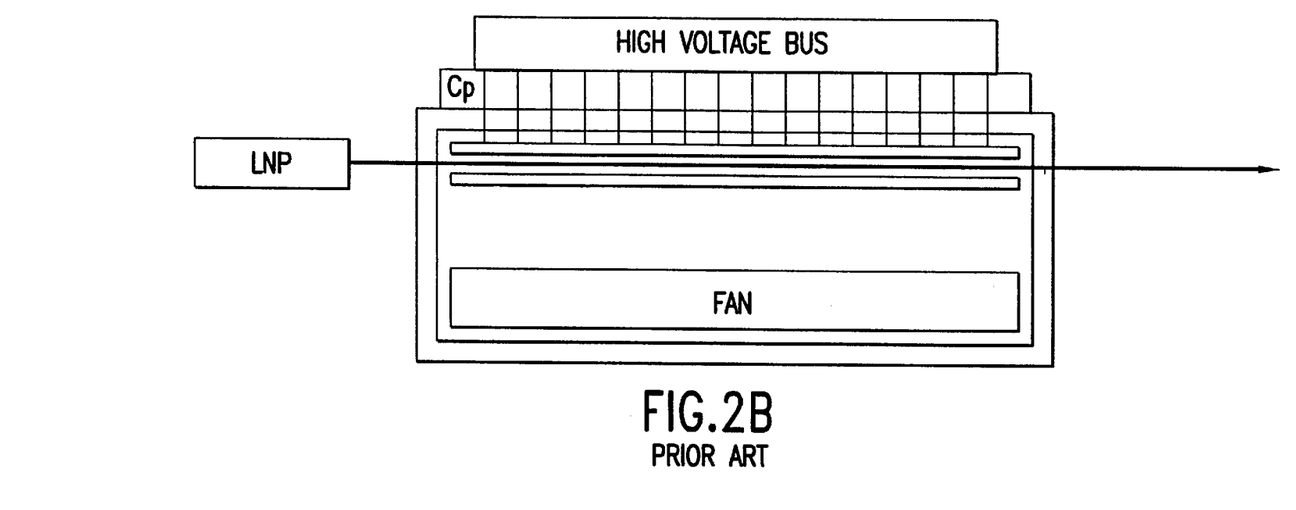

FIG. 1 shows a cross section of the laser chamber of a KrF excimer laser currently used as an integrated circuit lithography light source. FIGS. 2A and 2B are combination block diagram and schematic views of a portion of the laser system. A laser gas (in this case a mixture of about 1.0% krypton, 0.1% fluorine and the rest neon) at 3 atmospheres is contained in chamber 10 and circulated with fan 50 past heat exchanger 11 and between two elongated electrodes 18 and 20 at speeds of about 2 cm per millisecond. A gain medium is created between the electrodes by high voltage discharges (about 16,000 to 20,000 volts) applied by a peaking capacitor bank of twenty-eight 0.59 nf capacitors 19 at a pulse rate of, for example, 1000 Hz. The electrodes and the peaking capacitor bank are the final stages of high voltage pulse power system which provides the high voltage pulse discharge energy from standard plant power source such as standard 230 volt AC source. This type of laser is described in detail in several patents including U.S. Pat. No. 4,959,840 which is incorporated herein by reference. High voltage power supplies for these lasers utilize magnetic compression circuits which produce the high voltage pulses with durations of about 50 ns. One such circuit is described in U.S. Pat. No. 5,936,988 which is incorporated herein by reference. The high voltage is transferred to cathode 18 through 15 brass high voltage feed throughs 21 from high voltage bus 23 to cathode support bar 53. Anode 20 is mounted on anode support bar 44 which is grounded utilizing ground return cage 52 comprised of rods about which do not substantially affect gas flow. In this embodiment, laser gas flow is directed with flow control vanes 46 and 47 and flow restrictor 49 constructed of $Al_2O_3$ insulator material.

In this prior art laser system, preionization is provided by two preionizers 56. The line narrowing of many of these state-of-the-art KrF excimer lasers is accomplished using a line narrowing package (LNP) 15 which consists of a three prism beam expander 7, a tuning mirror 14 and a grating 16 arranged in a Littrow configuration as shown in FIG. 2A.

This basic laser system configuration, over the past ten years, has been extremely successful so that these lasers are the light source for most new high production rate integrated circuit lithography machines. Several hundred are now in operation producing millions of IC chips annually. The laser systems are extremely reliable, typically operating around the clock with forced downtimes much less than 1%.

With the 248 nm wavelength and a bandwidth of about 0.8 pm from the KrF laser, lithography devices can produce integrated circuits with features as small as about ¼ micron. However, there is a strong desire in the integrated circuit industry for further decreases in the feature sizes. A popular industry rule of thumb, known as Moore's Law (Gordon Moore, former Chairman of Intel Corporation) is that the feature size is reduced by a factor of two every three years. Smaller bandwidths is one of several parameters which permit further reduction in feature size.

Several well-known techniques for reducing the bandwidth of gas discharge laser systems (including excimer laser systems) utilize two separate lasers. In one such system, the first laser called a "master oscillator" is designed to provide a very narrow band beam and that beam is used as a seed beam in the second laser. If the second laser functions as a power amplifier, the system is referred to as a master oscillator, power amplifier (MOPA) system or a master-slave laser system. A primary advantage of the MOPA design as compared to the system shown in FIG. 2A is a substantial reduction of heat load on the LNP optics. If the second laser itself has a resonance cavity, the system is referred to as an injection seeded oscillator (ISO) and the seed laser is called the master oscillator and the downstream laser is called the power oscillator.

Laser systems comprised of two separate lasers tend to be substantially more expensive, larger and more complicated than comparable single laser systems. Therefore, commercial applications of two laser systems has been limited.

Figure 3A:
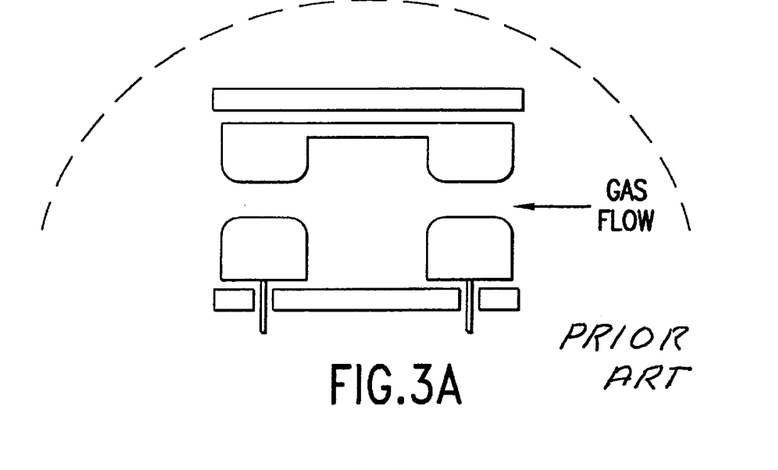
FIGS. 3A, 3B and 3C show prior art techniques for providing injection seeding in a single chamber.
Figure 3B:
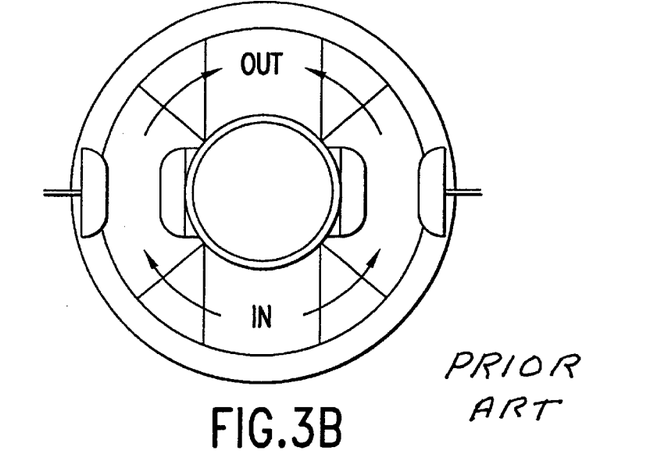
Figure 3C:
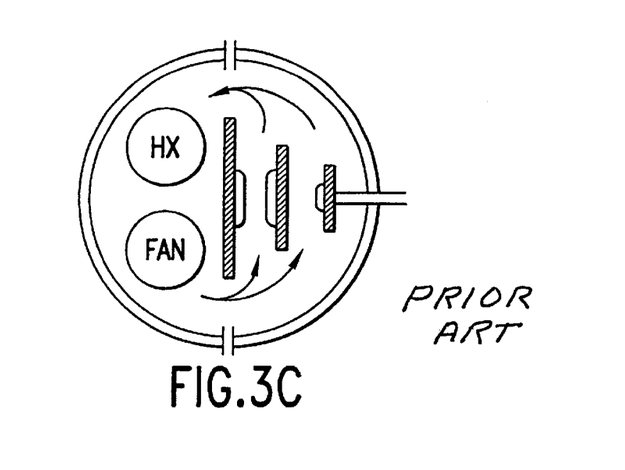

Systems have been proposed for using a single laser chamber to contain two sets of electrodes. For example, FIG. 3A shows a side-by-side arrangement described by Letardi in U.S. Pat. No. 5,070,513. Another arrangement shown in FIG. 3B described by Long in U.S. Pat. No. 4,534,035 in which the elongated electrode sets are positioned on opposite sides of the chamber. Gas flows from a common "in" plentum separately between the two sets of electrodes into a common "out" plenum. An arrangement proposed by McKee in U.S. Pat. No. 4,417,342 is shown in FIG. 3C. This system has two elongated electrode sets mounted parallel to each other on one half of the chamber. A tangential fan and heat exchanger is located in the other half. Gas flows in parallel through between the two sets of electrodes. The system shown in FIG. 3A has not been considered suitable for high pulse rate laser because debris from the upstream discharge interferes with the downstream discharge. According to an article published in Applied Physics B Lasers and Optics 1998, this laser is operated at a pulse repetition rate of about 100 pulses per second. The authors indicate that an attempt to operate at 1000 Hz would lead to turbulent flow which is not desirable for generation of a high quality beam. The system shown in FIG. 3C has not been considered suitable for high pulse rate lasers because splitting of the flow reduces the velocity of the gas between the electrodes by about 50% as compared to a single set of electrodes on the system shown in FIG. 3A. The system shown in FIG. 3B has not been considered satisfactory for high pulse rate lasers because the blower circulation is axial rather than tangential as shown in FIG. 1.

A need exists for a high pulse rate laser system combining concepts of the commercially successful single chamber, line narrowed gas discharge laser described above with the advantages of the MOPA on the ISO.

SUMMARY OF THE INVENTION

The present invention provides a single chamber gas discharge laser system having a pulse power source for producing electrical discharges at the rate of at least 1000 pulses per second. The discharge along with laser optics create two short lived gain media, one for producing a seed beam and the other for amplifying the seed beam. Laser gas circulation around a chamber circulation path is provided and the electrodes and discharges are arranged so that debris from one of the gain media is not circulated to the other gain media during discharges until the debris has made a loop around at least 90% of the chamber circulation path.

DETAILED DESCRIPTION OF THE PREFERRED EMBODIMENTS

In Line Gain Media

Figure 4A:
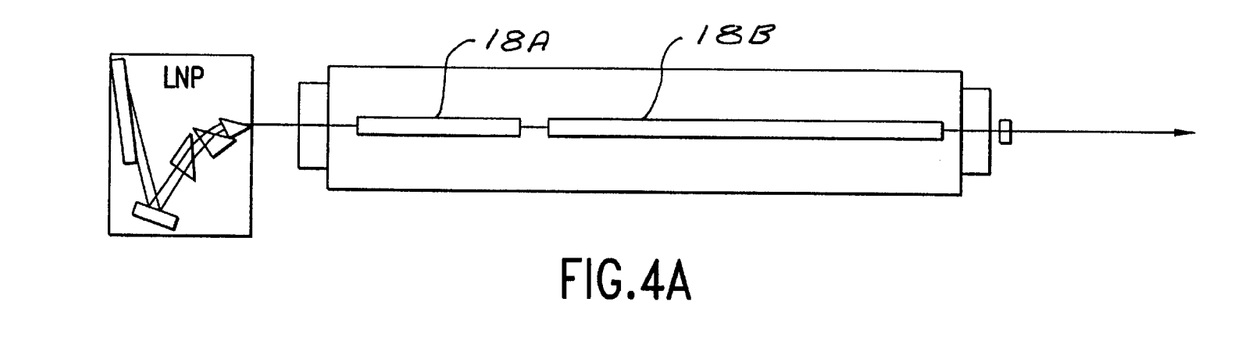
FIGS. 4A, 4B, 5A, 5B, 5C, 5D, 6A, 6B, 7A, 7B, 8A, and 8B show embodiments of the present invention with various electrode arrangements.
Figure 4B:
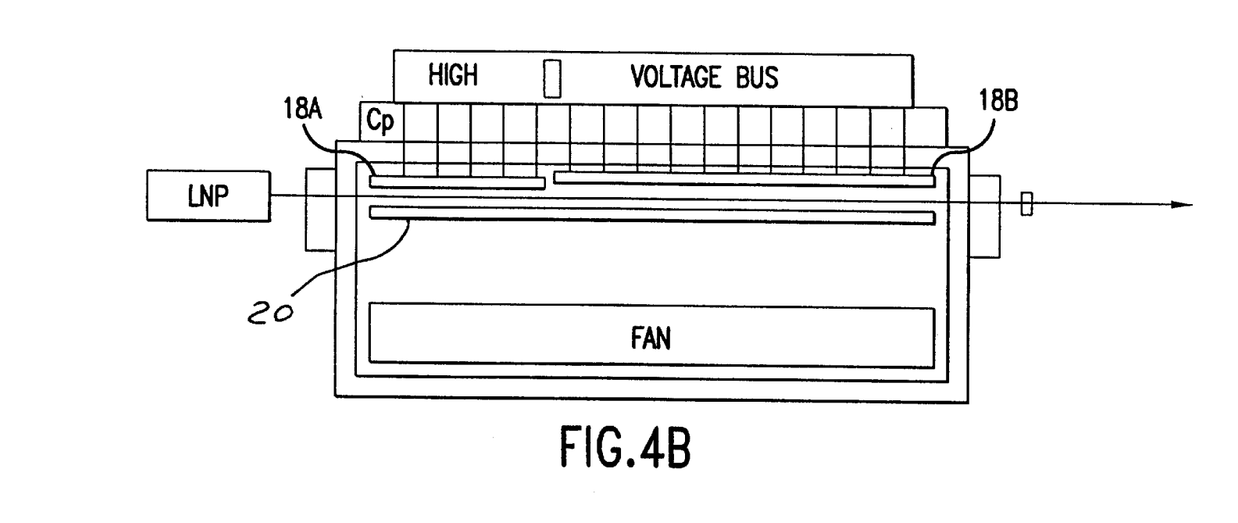

Drawings of a first preferred embodiment of the present invention which has been built and tested by Applicants is shown in FIGS. 4A and 4B. In this case, the cathode 18 of the prior art laser shown in FIGS. 2A and 2B is separated into a short cathode 18A and a long cathode 18B as shown in FIG. 4B. Short cathode 18A is positioned about 17 mm above anode 20 and fed by fine brass feed throughs 21 from high voltage bus 23 as shown in FIG. 1 whereas long cathode 18B is located in the prior art position of approximately 20 mm above anode 20 and fed by ten brass feed throughs 21 from the same high voltage bus 23. The result is that the discharge between short cathode 18A and anode 20 begins approximately 10 ns prior to the discharge between long cathode 18B and anode 20. Thus, laser light produced by short cathode 18A and anode 20 at the beginning of the discharge has time for up to two trips through line narrowing package 15 before the discharge begins between long electrode 18B and anode 20. The result is an increase in the pulse duration and a decrease in the line width of the beam.

Alternatives to the embodiment shown in FIGS. 4A and 4B is to provide the same spacing between the two cathodes and the anode but to provide for the earlier discharge electronically such as by adding additional inductance to the circuit comprising electrode 18B. In these alternatives, anode 20 could be separated into anodes 20A and 20B corresponding to 18A and 18B. Inductance could be added between the anode and ground. A more complicated approach would be to separate high voltage bus 23 so that a separate peaking capacitor bank is provided for each of the cathodes.

Off Set Gain Media

Figure 5A:
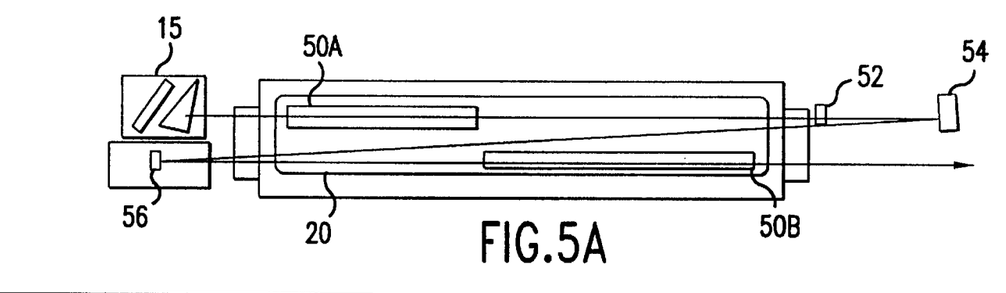
Figure 5B:
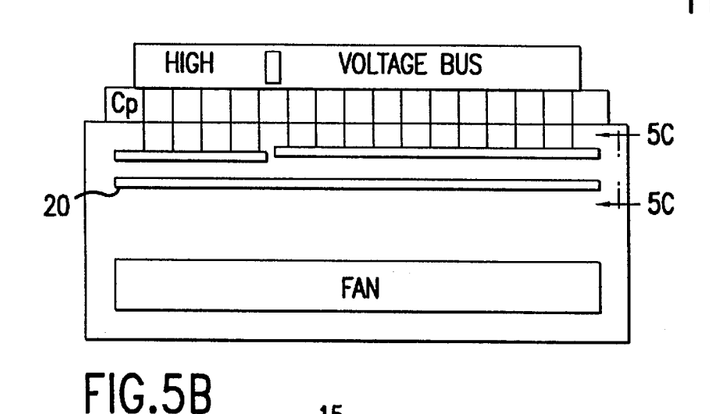
Figure 5C:
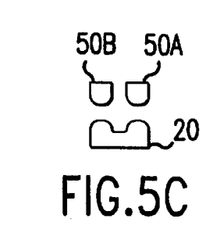

FIGS. 5A, 5B and 5C show an embodiment of the present invention similar to that shown in FIGS. 4A and 4B in which the gain media are offset from each other. Cathode 50A and anode 20 define a gain media of the seed portion of the laser system. The resonance cavity of the seed portion is defined by LNP 15 and output coupler 52 which may be a partially reflecting mirror with a reflectivity of about 20 percent. In this embodiment, the seed beam reflects off totally reflecting mirrors 54 and 56 and is amplified in the amplifier portion of the laser system in a gain medium created by cathode 50B and anode 20.

Figure 5D:
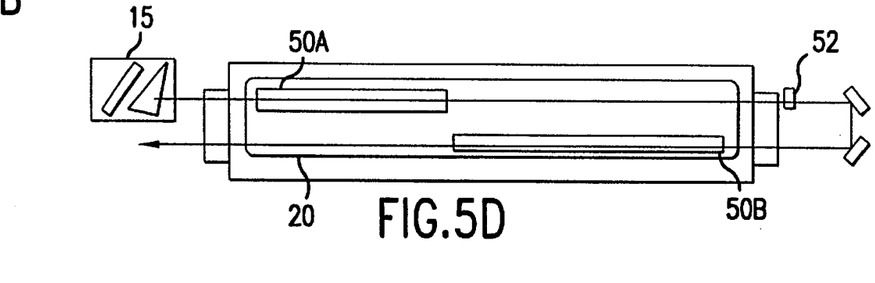
Figure 6A:
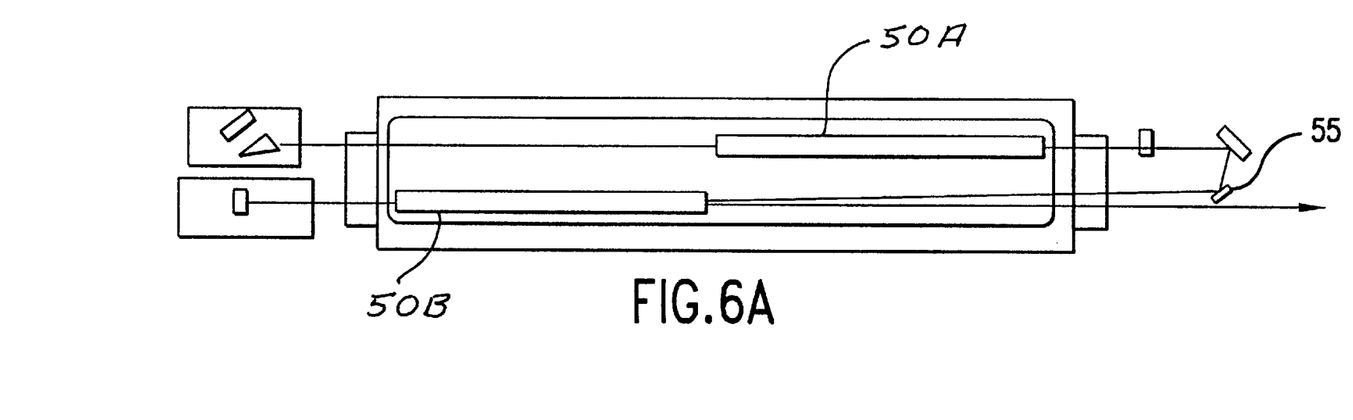
Figure 6B:
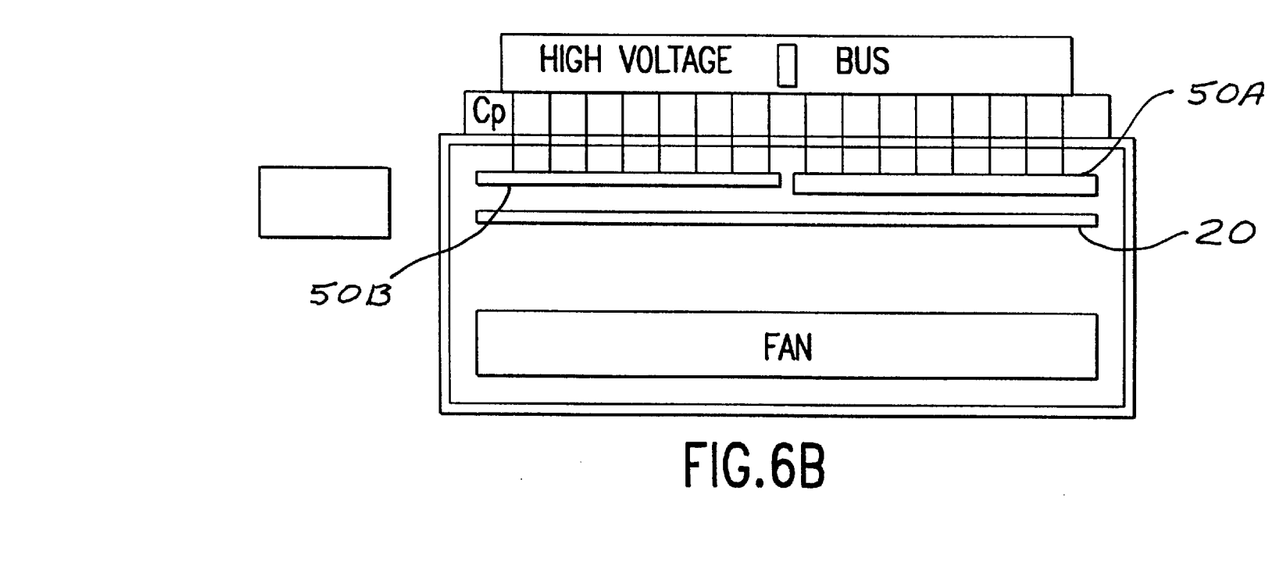

In the embodiment shown in FIGS. 6A and 6B an additional totally reflecting mirror 55 and a shifting of the electrodes permits two passes through the amplifying gain medium. In both embodiments, the electrodes or the electrical circuits are arranged to give the seed portion a head start of a few nanoseconds. (For example, for the KrF laser a head start for the seed portion could be about 20 ns. For the ArF the heat lead tim should be relatively shorter because the upper state lifetime for the ArF laser is shorter. These times may vary with cavities with differing geometries.) FIG. 5C shows how the cathodes and the anode of the FIG. 1 laser can be modified for these two embodiments. FIG. 5D shows an alternative to the 5A arrangement.

Side By Side Gain Media

Figure 7A:
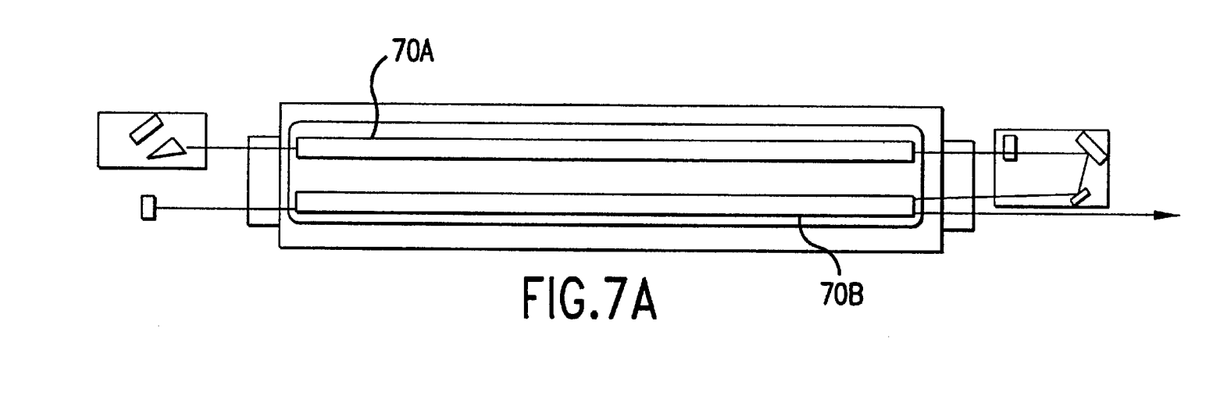
Figure 7B:
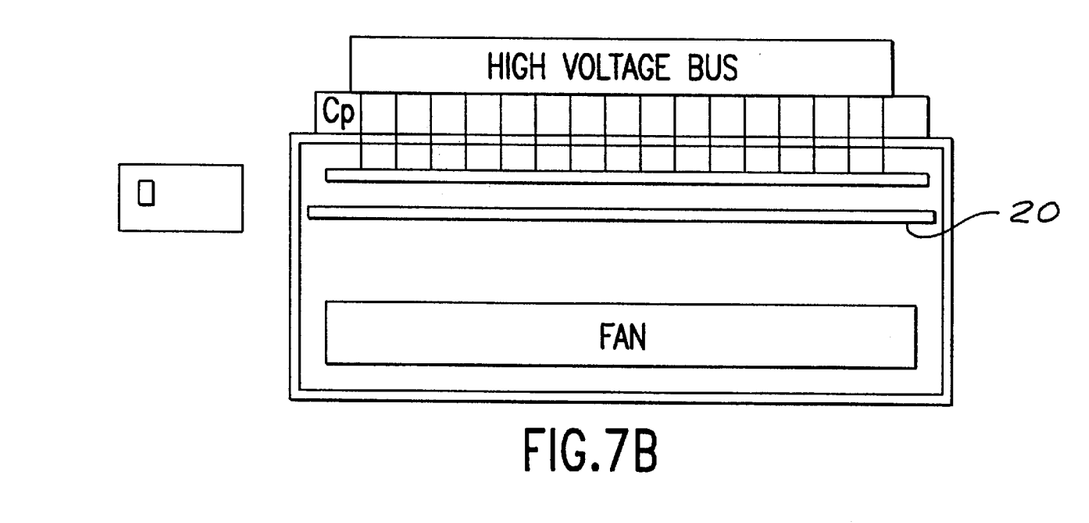
Figure 8A:
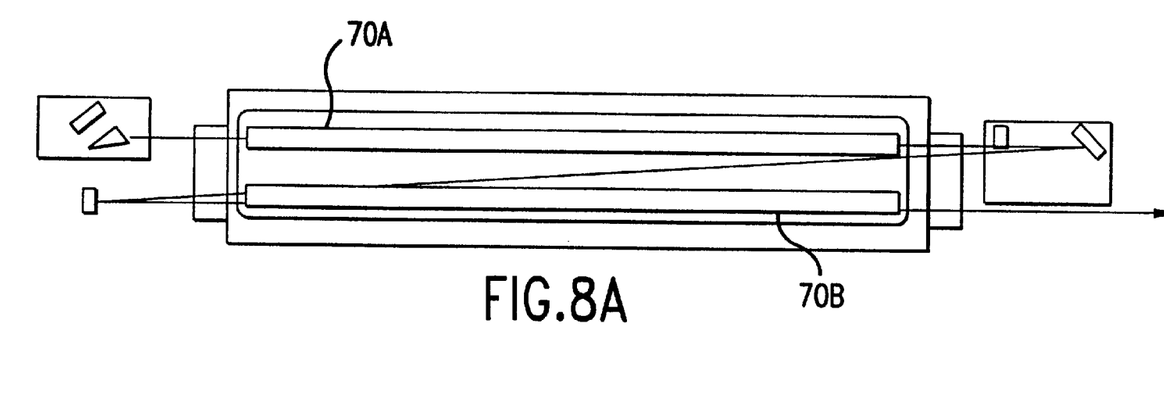
Figure 8B:
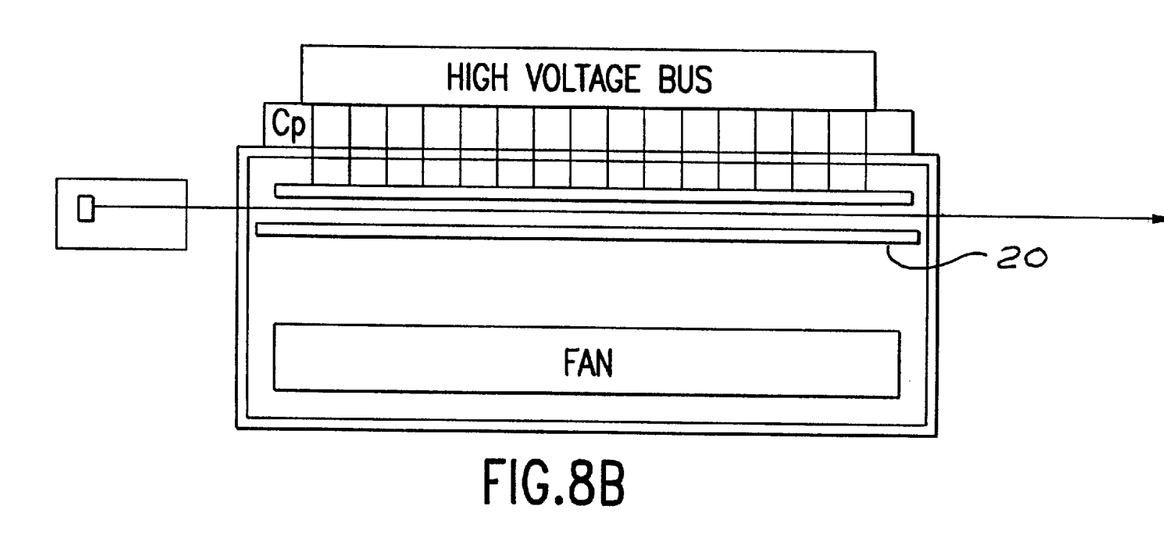

FIGS. 7A and 7B and FIGS. 8A and 8B show embodiments where the two gain media are side by side. FIGS. 7A and 7B embodiment provides for two passes through portions of the amplifier gain media. As stated in the Background section of this specification, debris from the upstream discharge could interfere with the downstream discharge. This problem is dealt with in this embodiment by providing very stable laser gas flow through between the electrodes and by providing a flow rate fast enough that debris from the upstream discharge passes the downstream gain region before the next pulse. Another alternative is to adjust the gas flow rate so that the debris from the upstream discharge is located about $2/3$ the distance between the electrodes at the time of the subsequent pulse. For example, if the laser is operating at a pulse rate of 2,000 Hz and the distance between the upstream and downstream electrode is 6 cm, the speed of the gas between the electrodes could be about 8,000 cm/sec so as to center the debris from the upstream discharge is about 2 cm upstream of the downstream electrodes during the first subsequent pulse and 2 cm downstream of the downstream electrodes during the second subsequent pulse.

In the FIGS. 7A and 7B and 8A and 8B embodiments, pulse power is preferably provided with just minor modifications to the prior art pulse power system of the prior art laser shown in FIGS. 1 and 2A and 2B. In a preferred embodiment, the portion of the peaking capacitor bank on one side of the laser chamber feeds cathode 70A and the capacitor on the other side feeds cathode 70B. In this embodiment the total number of capacitors is preferably increased from 28 to 40 (20 on each side). Cathode 70A is slightly closer to anode 20 than cathode 70B to give the seed a head start.

Slanted Seed Beam

Figure 9:
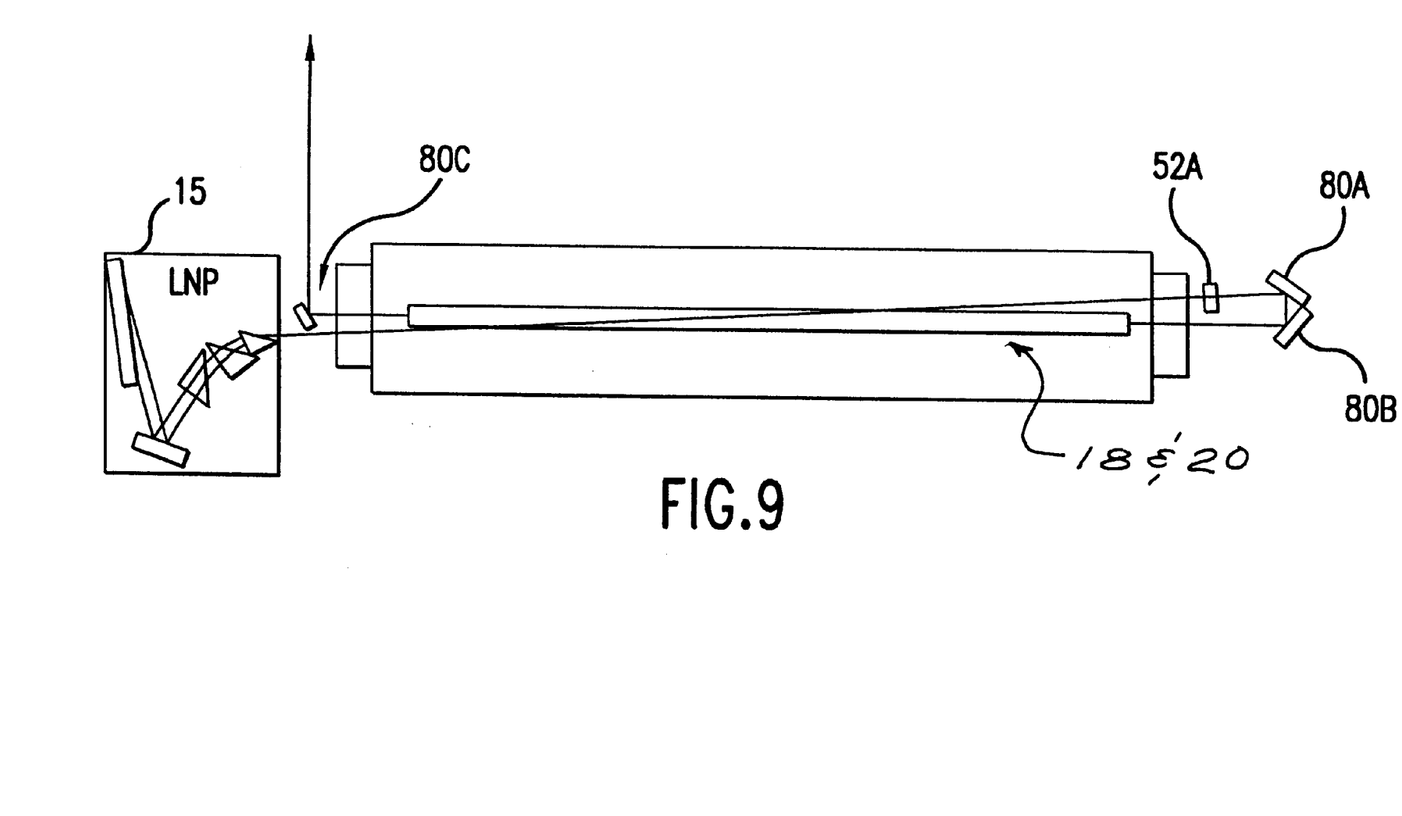
FIG. 9 describes a technique for avoiding seed beam distortion caused by variation of the index of refraction across a gain medium.

Another embodiment of the present invention is shown in FIG. 9. In this embodiment, the resonance cavity of a seed portion of the laser system is formed by prior art LNP 15 and prior art output coupler 52A which in this case is a 50% reflectivity mirror. As shown in FIG. 9 the seed cavity slants completely across the gain medium formed between the electrodes. During a typical pulse of a KrF excimer laser the beam would make about 5 trips through the seed gain medium. On each trip the light is both amplified and line narrowed in the seed cavity. On each trip about 50% of the light passes through output coupler 52A, and is reflected by mirrors 80A and 80B and is further amplified in the gain medium between mirrors 80B and 80C. For this embodiment the pulse power system for the laser preferably is arranged to produce a pulse shape similar to that shown in FIG 10C. This would provide a first pulse primarily for the seed beam and a second overlapping larger pulse for the amplified beam.

Excellent Line Narrowing With Slanted Beam

Figures 10A, 10B, 10C:
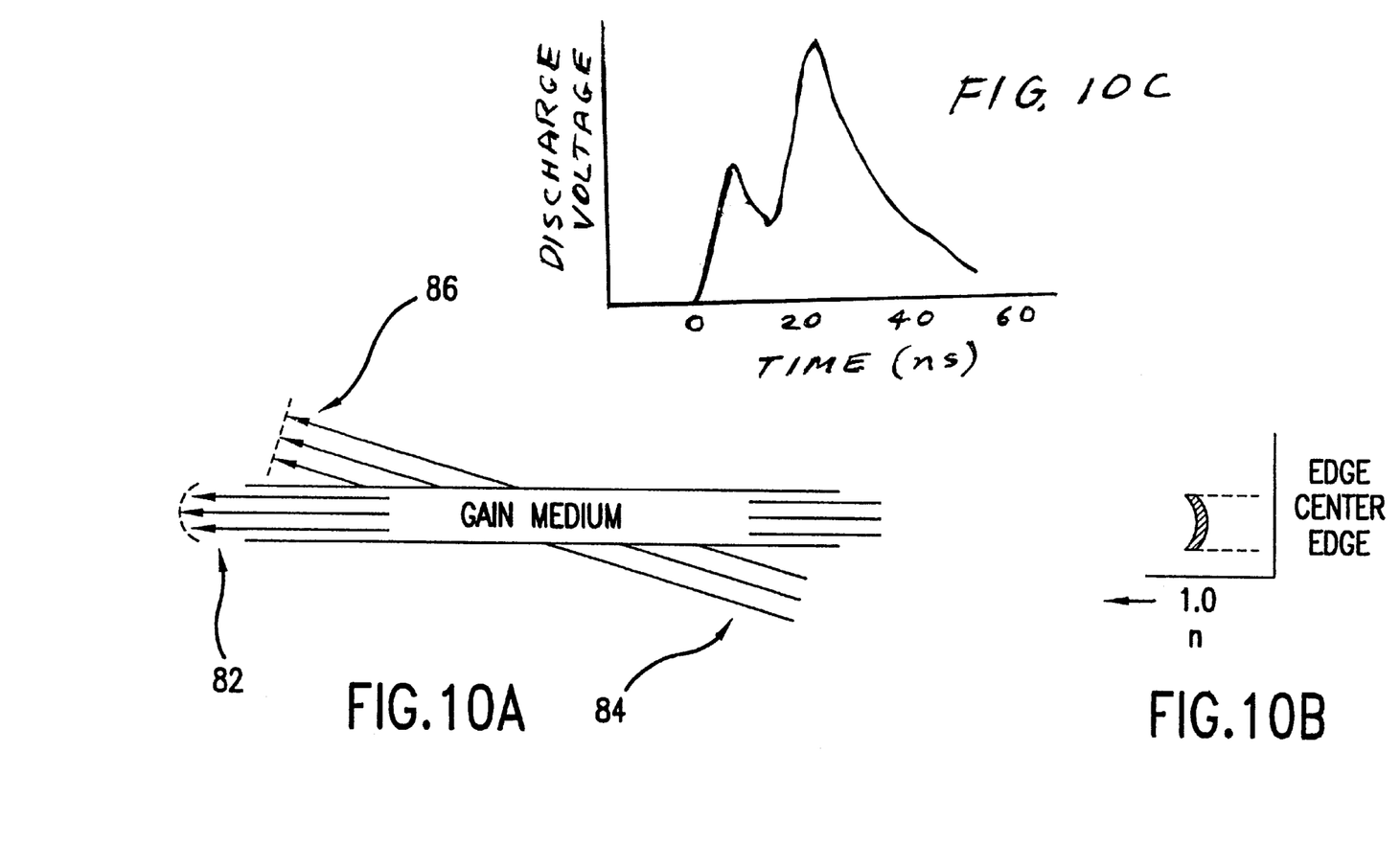
FIGS. 10A, 10B and 10C describe features of a preferred embodiment.

The slanting of the seed beam across the gain medium between the electrodes eliminates a significant problem with prior art systems such as that described in FIGS. 2A and 2B. This problem results from the fact that the index of refraction, n, (which is a measure of the phase velocity of the beam) near the edges of the gain medium is significantly higher than at the center of the gain medium. This means that the phase of light at both sides of the beam as it traverses the gain medium travels slower than the phase of the light in the center of the beam. This produces a distortion of the wave front entering the LNP. This distortion in turn limits the ability of the LNP 15 to produce very narrow band linewidths. This distortion can be somewhat compensated for by slightly bending the grating but Applicants have determined that much of the distortion in the gain medium is time dependent at nanosecond time intervals. The grating cannot respond to changes this quickly. By directing the beam slant-wise across the gain medium all portions of the beam see the same variations in index of refraction. FIG. 10B shows qualitatively how n varies across the gain medium in the horizontal direction. (The gain medium is, in a typical lithography excimer laser, about 5 mm wide in the horizontal direction and is about 18 mm high in the vertical direction. The index of refraction, in the vertical direction, is relatively flat over most of gain medium.

In FIG. 10A, three beams of light are shown passing through the gain medium along the axis of the gain medium, one in the center of the gain medium and the other two at the horizontal edges. As indicated at 82 the wave front is distorted because the beams at the edges travel slower than the one at the center. However, when three similar beams pass slantedly across the gain medium as shown at 84, they each encounter the same variation in index of refraction, thus they emerge on the other side "neck and neck" as shown at 86. A flatter wave front permits the LNP to more effectively line narrow the beam.

The present invention is especially applicable to gas discharge lasers producing ultraviolet light for laser lithography. This includes KrF and ArF excimer lasers and $F_2$ lasers. The present invention permits extremely narrow bandwidths which permits stepper and scanner machines to produce integrated circuits with improved revolution as compared to prior art systems.

Persons skilled in this art recognize that many embodiments of the present invention other than the ones specifically described are possible based on the teachings of the above disclosure. Therefore, the reader should determine the scope of the present invention by the appended claims and their legal equivalets.

We claim:

1. A single chamber gas discharge laser system with a line narrowed seed beam comprising:
    A) a single discharge chamber containing a laser gas and a heat exchanger;
    B) at least two elongated electrodes disposed inside said single discharge chamber and configured to provide at least two discharge regions,
    C) a pulse power source for providing high voltage electrical pulses to produce electrical discharges in each of said at least two discharge regions at rates of at least 1000 pulses per second,
    D) optical means defining at least one resonant cavity and defining, together with said at least two discharge regions and said pulse power source, a first gain region and a second gain region, said first and second gain regions producing optical gain only during said electrical discharges, which electrical discharges produce debris in each of said first and second discharge regions, said optical means comprising a line narrowing means for line narrowing said seed beam,
    E) a circulation means, comprising a tangential blower, for circulating laser gas and for:
        1) circulating debris produced in said first discharge region,
            a) past said heat exchanger and then
            b) back through either said first discharge region or said second discharge region and
        2) circulating debris produced in said second discharge region,
            a) past said heat exchanger and then
            b) back through either said first discharge region or said second discharge region,
    wherein said line narrowed seed beam is produced in said first gain region and subsequently amplified in said second gain region and wherein debris produced in each discharge region passes said heat exchanger prior to being circulated back through either said first or said second discharge region.

2. A system as in claim 1 wherein said at least two electrodes are three electrodes consisting of a first cathode, a second cathode and a single anode wherein said first cathode is closer to said anode than said second cathode and said first cathode and said anode define the first discharge region.

3. A system as in claim 2 wherein said optical means defines only one resonant cavity and said first and second discharge regions are in line with each other.

4. A system as in claim 2 wherein said optical means defines two resonance cavities and said first and second discharge regions are not in line with each other.

5. A system as in claim 1 wherein said at least two electrodes are three electrodes consisting of a first cathode, a second cathode and a single anode, said first cathode and said anode defining said first discharge region and said pule power means is configured to provide electrical pulses to said first cathode a few nanoseconds prior to providing electrical pulses to said second cathode.

6. A system as in claim 1 and further comprising a line narrowing module comprising beam expander means and a grating.

7. A system as in claim 1 wherein said second discharge region is located at a distance less than 10 centimeters downstream of said first discharge region and said circulation means is configured to produce flow serially through said first and second discharge regions at a speed such that debris from a particular discharge in said first discharge region is centered about $\frac{2}{3}$ the distance between the first discharge region and the second discharge region at the time of a first discharge following the particular discharge and the debris is centered about $1\frac{1}{3}$ the distance between the first discharge region and the second discharge region at the time of a second discharge following the particular discharge.

8. A single chamber gas discharge laser system with a line narrowed seed beam comprising:
    A) a single discharge chamber containing a laser gas and heat exchanger;

B) two elongated electrodes disposed parallel to each other inside said single discharge chamber and configured to provide a single discharge region, C) a pulse power source for providing high voltage electrical pulses to produce electrical discharges in said discharge region at rates of at least 1000 pulses per second, D) optical means positioned so as to define a first gain region running slant-wise across said discharge region and a second gain region running between said two electrodes parallel to them, E) a circulation means comprising a tangential blower configured to circulate substantially all of said laser gas through said discharge region, past said heat exchanger and back through said discharge region in a continuous path defining a circulation path;

wherein said line narrowed seed beam is produced in said first gain region and subsequently amplified in said second gain region.

9. A system as in claim 8 and further comprising a line narrowing module comprising a beam expander means and a grating said module forming part of said optical means and configured to line narrow said seed beam.

* * * * *